United States Patent [19]
Eriguchi et al.

[11] Patent Number: 5,650,336
[45] Date of Patent: Jul. 22, 1997

[54] METHOD OF PRESUMING LIFE TIME OF SEMICONDUCTOR DEVICE

[75] Inventors: Koji Eriguchi, Osaka; Yukiharu Uraoka, Nara, both of Japan

[73] Assignee: Matsushita Electric Industrial Co., Ltd., Osaka, Japan

[21] Appl. No.: 529,397

[22] Filed: Sep. 18, 1995

[30] Foreign Application Priority Data

Sep. 19, 1994 [JP] Japan ................................. 6-223364
May 31, 1995 [JP] Japan ................................. 7-133187

[51] Int. Cl.$^6$ ................................................. H01L 21/66
[52] U.S. Cl. ............................ 437/8; 437/170; 324/719
[58] Field of Search ...................... 437/8, 170; 324/158, 324/765, 551, 719

[56] References Cited

U.S. PATENT DOCUMENTS

| | | | |
|---|---|---|---|
| 3,939,415 | 2/1976 | Terasawa | 324/158.1 |
| 4,210,464 | 7/1980 | Tanaka et al. | 148/1.5 |
| 5,307,385 | 4/1994 | Shimanuki | 376/249 |

*Primary Examiner*—Jey Tsai
*Attorney, Agent, or Firm*—McDermott, Will & Emery

[57] ABSTRACT

A plurality of different constant currents are implanted into an element of a semiconductor device such as a gate oxide film and a metal wire, a charge-to-breakdown (or a breakdown time) is measured from a result of current implantation, a relationship between a constant current value and the charge-to-breakdown (or a breakdown time) is determined, and a time-sequence change in the current during application of a constant voltage is presumed. Next, of a time-sequence change characteristic of the current during application of the constant voltage, current values during the respective minute periods are approximated to a constant current value. Consumption ratios of the life time due to the respective current values are calculated based on a relationship between the constant current value and the charge-to-breakdown (or a breakdown time), the consumption ratios of the life time are accumulated, and the sum of the respective minute periods which is obtained when the accumulation value becomes 1 is presumed to be the life time. Since the life time during application of the constant voltage is presumed utilizing a result of a constant current test which takes only a short time, it is possible to quantitatively, quickly and accurately presume the reliability life time of a gate oxide film and a metal wire and a TFT, etc.

15 Claims, 13 Drawing Sheets

METHOD OF PRESUMING LIFE TIME OF SEMICONDUCTOR DEVICE

BACKGROUND OF THE INVENTION

The present invention relates to a method of presuming the life time of a semiconductor device, and particularly, to improvement in an evaluation method.

In recent years, as semiconductors have smaller and smaller geometry, reliability of a semiconductor device is becoming more important. For example, reliability of a gate oxide film of a MOSFET (Metal-Oxide-Semiconductor Field-Effect-Transistor) determines characteristics of a semiconductor device itself, and therefore, a number of achievements of research have been disclosed. If a transistor has a gate length of approximately 0.35 μm, the thickness of a gate oxide film is 8 to 9 nm. Hence, to form the gate oxide film with an excellent characteristic and to reduce damage to the gate oxide film due to plasma or the like during processes bear an increasing technical importance.

It is necessary to find the level of damage to gate oxide films during processes to reduce deterioration of the gate oxide films. To grasp the level of the damage, it is necessary to accurately know the life time of each one of the gate oxide films which are damaged differently. To satisfy this need, presumption of the life time of a gate oxide film is also becoming important. The following evaluation methods are currently known as a method to presume the life time:

1) Evaluation utilizing an applied lamp voltage;
2) Evaluation utilizing an applied constant voltage; and
3) Evaluation utilizing an implanted constant current.

FIGS. 17a to 17c are flow charts of the three evaluation methods above.

As shown in FIG. 17a, the evaluation method 1) utilizing an applied lamp voltage evaluates a wafer as a whole. At Step ST1, a lamp voltage is applied to an insulation film which is formed on the wafer and the applied voltage is increased. At Step ST2, a current value at the time when insulation breakdown occurs in the wafer and a current flows is monitored. At Step ST3 and Step ST4, breakdown modes are classified and whether Good or Bad is judged. Breakdown occurs in about $10^3$ sec.

As shown in FIG. 17b, in the evaluation method 2) utilizing an applied constant voltage, a constant voltage is applied to an insulation film at Step ST11 and a current value is monitored during application of the constant voltage at Step ST12. The applied constant voltage alters the insulation film with time. As breakdown of the insulation film occurs due to deterioration, the time at which breakdown of the insulation film occurs is detected at Step ST13. Breakdown occurs in about $10^5$ sec.

As shown in FIG. 17c, in the evaluation method 3) utilizing an implanted constant current, a constant current is implanted into an insulation film at Step ST21. At Step ST22, a voltage value which increases with time is monitored. The time at which breakdown of the insulation film occurs is detected at Step ST23. Breakdown occurs in about $10^4$ sec.

Further, a TFT (Thin-Film-Transistor) as well which is used in a liquid crystal display panel, a demand for which has been noticeably growing recently in particular, must comprise a reliable gate oxide film. The reliability is evaluated basically by the evaluation methods described above.

In addition, a number of engineers are involved in developing improved evaluation methods of evaluating reliability of elements other than that of a gate oxide film. For instance, metal wires used in a semiconductor device deteriorate with time and electrically fracture due to a defect known as a void (i.e., electro migration, hereinafter "EM"). A widely used evaluation method is a method in which a constant current implanted into a metal wire and a time until breakdown is measured while monitoring a resistance value of the metal wire. This method as well, presuming the life time based on a current value, may not accurately presume the life time of the metal wire used in a semiconductor device which operates basically under the control of a voltage. While some evaluation methods use a constant voltage, such methods take a longer time for evaluation than methods which use an implanted constant current, which situation is similar to evaluation of gate oxide films.

Table 1 shows advantages and disadvantages of the three evaluation methods 1) to 3) such as a time needed for evaluation and the accuracy of life time presumption.

TABLE 1

|  | Measurement Time | Quantification |
| --- | --- | --- |
| Applied Lamp Voltage | $\sim 10^3$ s | Inappropriate |
| Applied Constant Voltage | $>10^5$ s | Appropriate |
| Implanted Constant Current | $\sim 10^4$ s | Most Appropriate |

From Table 1, it is understood that these evaluation methods have the following problems.

The evaluation method 1) utilizing an applied lamp voltage takes the shortest time to evaluate among the evaluation methods. However, since the method 1) detects only whether breakdown has occurred, it is difficult to quantify deterioration of a gate oxide film or to presume the life time of the gate oxide film, although comparative life time measurement is possible.

Next, the evaluation method 2) utilizing an applied constant voltage is the most popular as a life time presumption method. This is because semiconductor devices are generally voltage-controlled and therefore the life time presumed by the evaluation method 2) is a very accurate value which well expresses the actual condition of the semiconductor devices. However, a time necessary for evaluation is the longest, $10^5$ sec among the three evaluation methods, requiring rather many days for evaluation. While the evaluation method 2) is applicable to a so-called accelerated test which is conducted with a high substrate temperature, if a testing time is to be reduced to a practical level, the accelerated test must be conducted under a substantially high temperature and hence errors in data become extremely large or other problems occurs. For this reason, the evaluation method 2) is not likely to yield quantitative, fast and accurate evaluation.

On the other hand, a time needed for evaluation in the evaluation method 3) utilizing an implanted constant current is about 1/10 or shorter than that in the evaluation method 2). It is possible to quantify deterioration of a gate oxide film in the evaluation method 3). However, since a resistance of the insulation film increases because electric charges are trapped as a current is implanted, a voltage value needs be increased to ensure that a current of a constant value flows. Despite this need, since a semiconductor device is controlled by a constant voltage in reality, the life time presumed by changing the voltage and flowing a constant current is not an enough accurate value which well expresses the actual condition of the gate oxide film.

Evaluation of EM in a metal wire described earlier is similar to evaluation of an insulation film in that the conventional evaluation utilizing an implanted constant current cannot realize accurate life time presumption.

In addition to an unpractically long testing time, in some cases, a test itself is difficult under a certain electric stress.

SUMMARY OF THE INVENTION

The present invention has been made to solve these problems. Accordingly, an object of the present invention is to provide a quantitative, fast and accurate method of presuming the life time of a semiconductor device which comprises an insulation film such as a gate oxide film, a metal wire, etc., by applying an electric stress such as a current and a voltage while ensuring a characteristic of a life time test which is conducted with two types of electric stresses applied.

To achieve the object above, in the method of presuming the life time of a semiconductor device according to the present invention, a test is conducted under a first electric stress which permits a practical testing and the life time is then presumed under a second electric stress which yields a more accurate life time utilizing a result of the precedent test.

More precisely, in a first method of presuming the life time of a semiconductor device according to the present invention, a time from application of an electric stress such as a current and a voltage onto an element of the semiconductor device until said element becomes unusable is measured and thereafter the life time of the semiconductor device is presumed with a second electric stress applied while utilizing a test in which a first electric stress is applied, said method comprising: a first step of implanting a constant first electric stress having a plurality of values into an element of a semiconductor device and measuring the life time of said semiconductor device under each constant first electric stress and a time-sequence change in the value of said second electric stress; a second step of calculating a relationship between said constant first electric stress which is implanted into the element of said semiconductor device and the life time of said semiconductor device under said constant first electric stress, based on a result of measurement of the life time which is measured at said first step under said constant first electric stress of each constant value; a third step of calculating a characteristic of a time-sequence change in said first electric stress during application of said second electric stress having a predetermined value onto the element of said semiconductor device, based on the time-sequence change in said second electric stress which is measured at said first step; a fourth step of dividing the time-sequence change in said first electric stress which is obtained at said third step under said second electric stress having the predetermined value into a plurality of minute periods, approximating the value of said first electric stress for each minute period and calculating a ratio at which the life time under said constant first electric stress which is calculated at said second step is consumed during each minute period; and a fifth step of determining the life time of the semiconductor device as the sum of the minute periods which is obtained when the accumulation value of life consumption ratios each during each minute period calculated at said fourth step reaches a predetermined value.

In this method, a change in the life time under the first electric stress is found at the second step utilizing a result of the measurement obtained at the first step. A change in the first electric stress with time is presumed under the second electric stress at the third step. Hence, a life consumption ratio during a minute period at each time point calculated at the fourth step well quantifies a part of the life which is consumed in an element of the semiconductor device due to the first electric stress. In addition, since the minute periods are obtained by dividing the time-sequence change in the first electric stress which is caused by application of the predetermined second electric stress, the sum of the life consumption ratios for the respective minute periods well expresses the life time with the predetermined second electric stress applied. Hence, if a test under the second electric stress takes a long time or when a test under the second electric stress is difficult, for example, the test under the second electric stress may not be conducted. Rather, the life time of the semiconductor device with the predetermined second electric stress applied is presumed while conducting a test in which the first electric stress is applied. That is, quantitative, fast and accurate presumption which is suitable to the type of an element forming the semiconductor device and characteristics of the semiconductor device is possible.

In the first method of presuming the life time of a semiconductor device above, said life time is defined as a time until breakdown of for an element of the semiconductor device occurs, and each life consumption ratio during each minute period is calculated by dividing each minute period by a breakdown time under said constant first electric stress at said fourth step.

According to this method, using a time until breakdown of the element forming the semiconductor device as a parameter, the life time of the semiconductor device is presumed. Hence, it is possible to obtain useful information regarding the reliability of the element forming the semiconductor device which remains operative until breakdown.

In the first method of presuming the life time of a semiconductor device above, said life time is changed into a charge-to-breakdown of charges implanted until breakdown of the element of the semiconductor device occurs, a relationship between the value of said constant first electric stress and the quantity of charges which are implanted until breakdown of the element of the semiconductor device occurs is calculated at said second step, and each life consumption ratio is calculated by dividing the product of said first electric stress for each minute period and each minute period by said breakdown quantity under said constant first electric stress at said fourth step.

According to this method, the life time of the semiconductor device is presumed using the quantity of electric charges implanted before breakdown of the element forming the semiconductor device as a parameter. Hence, it is possible to obtain useful information regarding the reliability of the element forming the semiconductor device such as an insulation film and a semiconductor film whose characteristics change by accumulated electric charges.

In the first method of presuming the life time of a semiconductor device above, the predetermined second electric stress may be a constant value at the fourth step.

Since the life time of the semiconductor device is presumed based on a change in the first electric charge which is obtained during application of a constant value of the second electric stress, the presumption method is simpler than a method which requires to the change the first electric charge.

In the first method of presuming the life time of a semiconductor device above, the life time of the semiconductor device may include a temperature acceleration coefficient at said first step and said third step.

Since a temperature accelerated test is conducted which utilizes the phenomena that a temperature change reduces a testing time, the method further reduces the time which is necessary to presume the life time.

In the first method of presuming the life time of a semiconductor device above, said first electric stress is a current and said second electric stress is a voltage.

This method realizes quantitative and accurate life time presumption by a test which uses a constant voltage, while in reality conducting a test which uses a constant current which takes a short testing time on a semiconductor device which is often controlled by a constant voltage in reality.

In the second method of presuming the life time of a semiconductor device above, the element forming the semiconductor device may be a gate oxide film.

According to this method, it is possible to obtain quantitative and accurate information in a short time regarding the reliability of a gate oxide film of a MOSFET, a TFT, etc.

In the second method of presuming the life time of a semiconductor device above, the element forming the semiconductor device may be a ferro electric film of a memory.

According to this method, it is possible to obtain quantitative and accurate information in a short time regarding the reliability of a ferro electric film of a memory in which information is repeatedly written in and deleted from.

In the second method of presuming the life time of a semiconductor device above, a characteristic of the time-sequence change in the current is calculated at said second step by approximating that a current which flows in the element of said semiconductor device under a predetermined applied constant voltage remains constant until a predetermined time and then changes in proportion to a time to −0.4th power.

This is suitable particularly to presumption of the life time of a gate oxide film, and the thickness of the gate oxide film in this case is preferably 6 nm or thicker.

According to this method, it is possible to presume the life time of a semiconductor device easily and fast.

In a third method of presuming the life time of a semiconductor device according to the present invention, a life time which is defined as a time measured from application of a predetermine constant voltage onto a metal wire of a semiconductor device until the metal wire becomes unusable, the method comprising: a first step of implanting a constant current into the metal wire of the semiconductor device and measuring the life time of the metal wire and a time-sequence change in the voltage; a second step of calculating a relationship between the value of the constant current implanted into the metal wire and the life time of the metal wire based on the life time of the metal wire which is measured at said first step; a third step of calculating a time-sequence change in the current during application of the constant voltage onto the metal wire, based on the time-sequence change in the voltage which is measured at said first step; a fourth step of dividing the time-sequence change in the current during application of the constant voltage which is obtained at said third step into a plurality of minute periods, approximating current values during the minute periods to a constant value and calculating a rate at which the life time during application of the constant current calculated at said second step is consumed during each minute period; and a fifth step of accumulating the life consumption ratios during the minute periods which are calculated at said fourth step in an order of time to yield an accumulation value and determining the sum of the minute periods which is obtained when the accumulation value reaches a predetermined value as the life time of the semiconductor device.

In the third method of presuming the life time of a semiconductor device above, the life time of the metal wire is defined as a time required until breakdown of the metal wire, and a plurality of values of a constant current are implanted to electrically destroy the metal wire and the time required until breakdown of the metal wire is measured with each current value at said first step.

According to these methods, it is possible to accurately presume the life time of a metal wire of a semiconductor device which is often controlled by a constant voltage, under a constant voltage condition which is close to that during actual use of the device and in a short testing time as in a test which uses a constant current.

In the respective methods of presuming the life time of a semiconductor device above, the life time is defined as the sum of the minute periods which is obtained when the accumulation value of the life consumption ratios during the minute periods reaches an inverse number of a safety coefficient at said fifth step.

According to this method, it is possible to presume the life time of a semiconductor device considering a safety coefficient and to obtain information which is useful for judging conditions of designing and processes.

DETAILED DESCRIPTION OF THE INVENTION

Model for Evaluating Life Time

Before describing preferred embodiments of the present invention, a description will be given on a model of a relationship between an electric stress and a life time, i.e., a characteristic aspect of a life time presumption method according to the present invention and the validity of the model.

First, taking a gate oxide film as an example, a life time presumption method used for an insulation film or the like will be described.

Figure 17A:
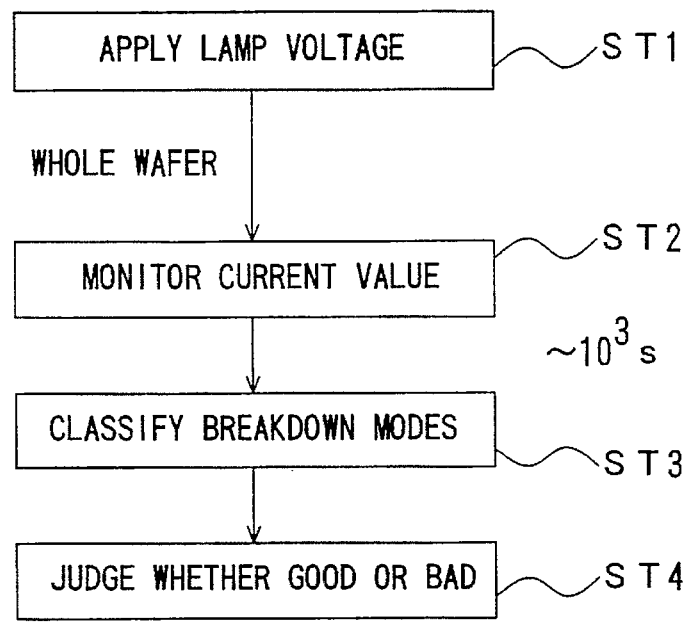
FIG. 17a is a flow chart showing a sequence of evaluation utilizing an applied lamp voltage according to conventional life time presumption of a semiconductor device and FIGS. 17(b) and (c) are flow charts showing a sequence of evaluation utilizing an applied constant voltage and a flow chart showing a sequence of evaluation utilizing an implanted constant current.
Figure 17B:
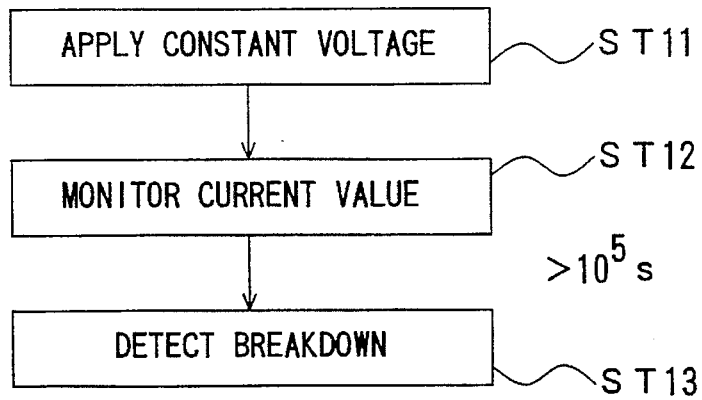
Figure 17C:
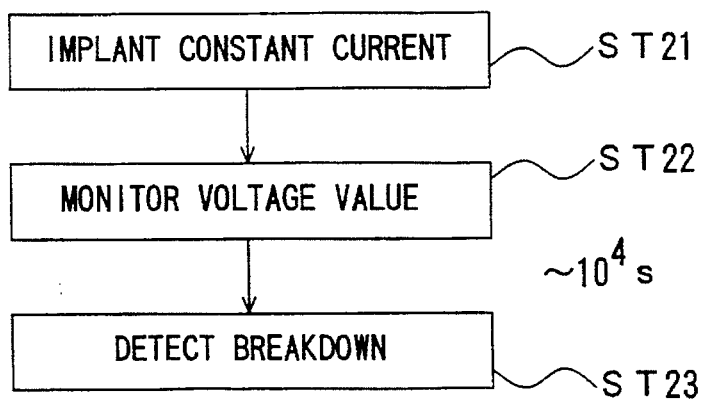

In the conventional evaluation method utilizing an implanted constant current shown in FIG. 17b, a constant current J (A/cm$^2$) is implanted into a gate oxide film and a time t (sec) taken until breakdown is measured. The product (J×t) of the current density J and the time t is used as a charge-to-breakdown QBD (C/cm$^2$), and the reliability life time of the gate oxide film is evaluated based on a value of the product. In short, the larger the charge-to-breakdown QBD is, the longer the reliability life time of the gate oxide film is. This is because most of damage to a gate oxide film during manufacturing processes of a semiconductor device is created by application of a stress current onto the gate oxide film, and therefore, the damage is expressed by the charge-to-breakdown QBD.

Figure 2:
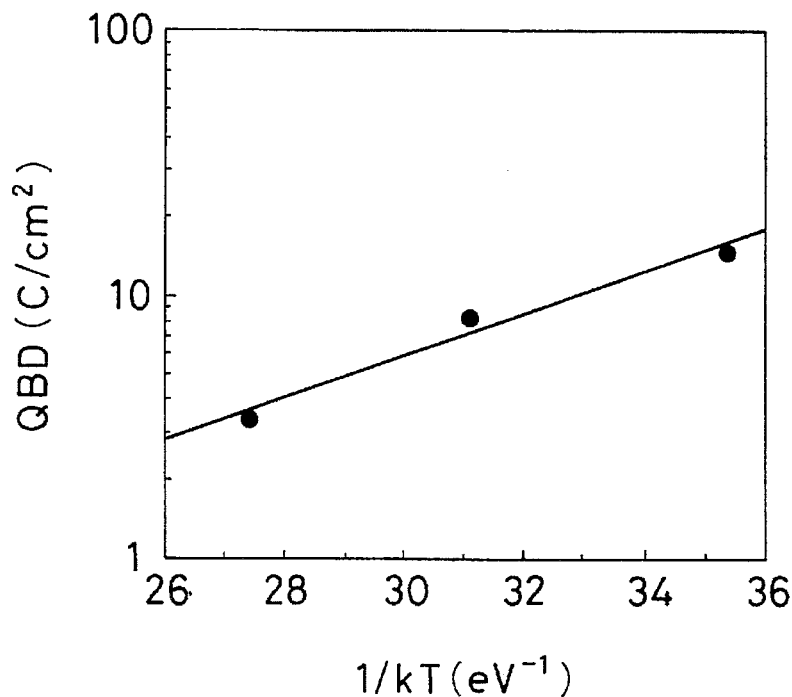
FIG. 2 is a view showing a dependency of a charge-to-breakdown QBD on a substrate temperature.
Figure 3:
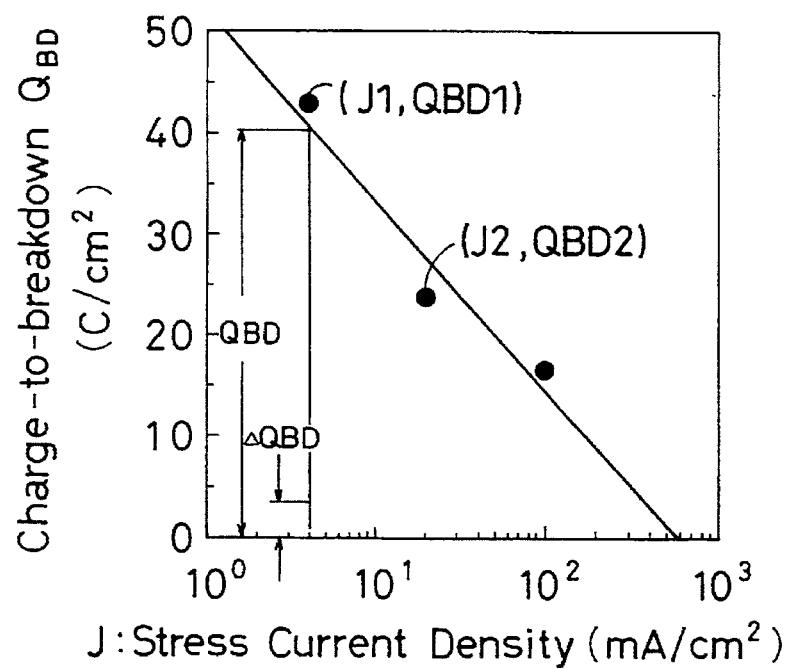
FIG. 3 is a view showing a relationship between the charge-to-breakdown QBD and a current value in a test utilizing an implanted constant current.

However, the charge-to-breakdown QBD of even the same gate oxide film changes depending on an environment in which measurement is conducted. It is known that the charge-to-breakdown QBD largely changes depending on a temperature of a substrate and a density of an implanted current, for example. FIGS. 2 and 3 show an example of this characteristic.

FIG. 2 shows a dependency of the charge-to-breakdown QBD on a substrate temperature T. There are some other studies on the substrate temperature dependency of the charge-to-breakdown QBD, and those reports confirm the same dependency as that shown in FIG. 2. In FIG. 2, a reciprocal number (K) of the substrate temperature is measured along a horizontal axis and the charge-to-breakdown QBD is measured along a vertical axis.

Figure 4:
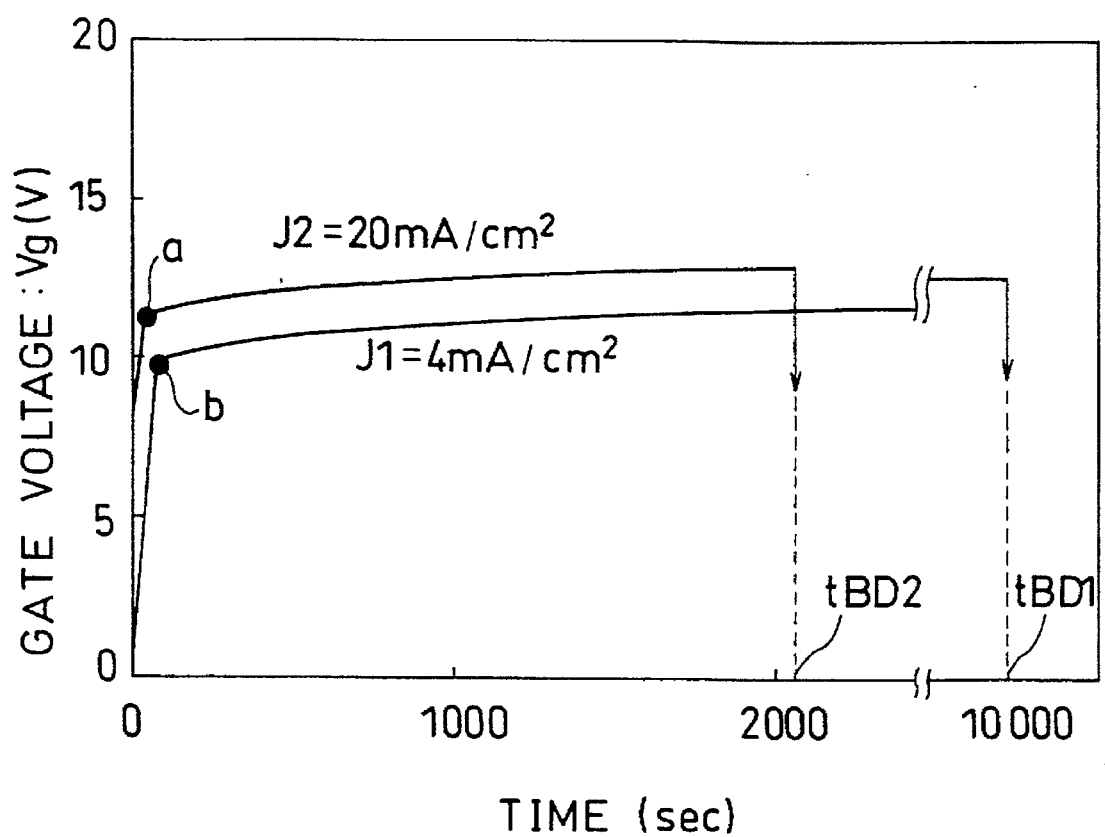
FIG. 4 is a view showing an example of a change in a gate voltage with time in a test utilizing an implanted constant current.

FIG. 3 shows a dependency of the charge-to-breakdown QBD on the current density J. In FIG. 3, a horizontal axis represents the current density J (A/cm$^2$) and a vertical axis represents the charge-to-breakdown QBD. The dependency of the charge-to-breakdown QBD on the current density J is calculated as follows. That is, when constant currents J1, J2 ... having different values from each other are implanted, a gate voltage Vg changes as shown in FIG. 4 with the stress time t. The products QBD1, QBD2 ... of the current densities J1, J2 ... and the corresponding breakdown times tBD1, tBD2 ... shown in FIG. 4 are detected, and values (J1, QBD1), (J2, QBD2) ... are plotted thereby yielding the characteristic shown in FIG. 3. If the current density J is marked in log numbers along the axis, a function J-QBD exhibits a linearity. The dependency shown in FIG. 3 found in the test conducted for the present invention is generally universal to a number of other study reports regarding the dependency of the charge-to-breakdown QBD on the current density J.

Figure 5:
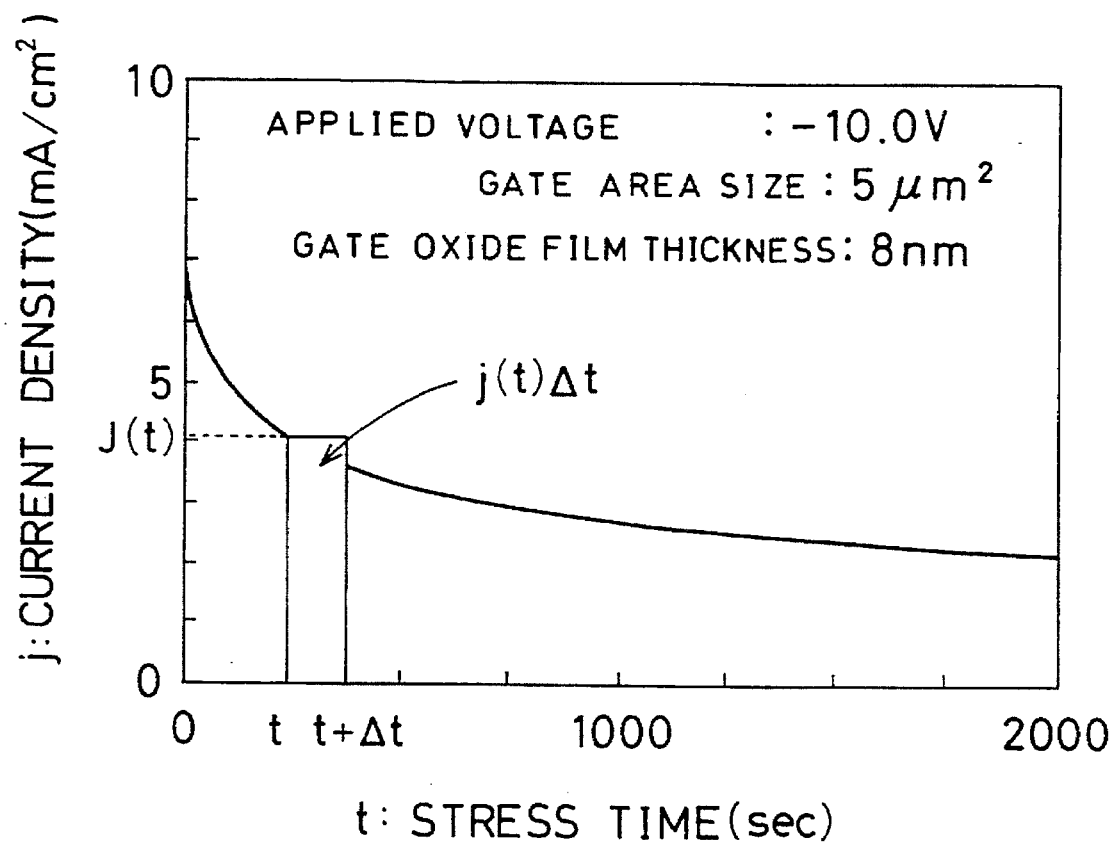
FIG. 5 is a view showing a relationship between a density of a current which flows in a gate oxide film and a stress time during application of a constant voltage.

On the other hand, FIG. 5 shows a time-sequence change in a current density j during application of a constant voltage. In FIG. 5, the stress time t (sec) is measured along a horizontal axis and the current density j (mA/cm$^2$) of a current which flows in a gate is measured along a vertical axis. During presumption of the life time of a gate oxide film utilizing an applied constant voltage, deterioration with time of the gate oxide film (e.g., charges trapped in the oxide film) decreases the current density j of the current which flows in the gate oxide film. That is, the current density j of the current which flows in the gate oxide film is a function of time, expressed as j(t). Hence, at each measurement step, the life time is considered to be consumed apparently by j(t)Δt (C/cm$^2$)=ΔQBD during a minute period Δt (sec). However, since the charge-to-breakdown QBD changes depending on a value of the implanted constant current density J as shown in FIG. 3, an effective consumed life during the period Δt shown in FIG. 5 changes depending on the time t from which the period Δt is measured. For this reason, it is still impossible to quantify an effective consumed life.

To deal with this, a model for quantifying as below is proposed.

First, consumed life during application of the constant voltage is accumulated. It is assumed that breakdown of the gate oxide film occurs when an accumulation value reaches a certain value. The current density j(t) during each minute period Δt of the current-time characteristic curve during application of the constant voltage shown in FIG. 5 is approximated to a constant value J, and an effective life consumption ratio during each minute period Δt from the time t to a time (t+Δt) is defined as j(t)Δt/QBD(J) (j(t)=J during the period Δt). A charge-to-breakdown QBD(J) expresses the charge-to-breakdown QBD during application of the constant current density J to the gate oxide film. In other words, the life time is consumed by the "ratio" j(t)Δt/QBD(J) during each minute period Δt. For example, the current density j(t) at the time t is about 4 (mA/cm$^2$) in FIG. 5, and therefore it is found that the life time is consumed by the ΔQBD (=j(t)Δt) from the charge-to-breakdown QBD which corresponds to the current density J=4 (mA/cm$^2$) shown in FIG. 3. An effective life consumption ratio ΔQBD/QBD is accumulated with respect to each current density j(t) which changes during application of the constant voltage, and breakdown of the gate oxide film occurs when the sum of the ratios finally reaches 1. This relationship is expressed by the following equation (1):

$$\Sigma\{j(t)\Delta t/QBD(J)\}=1 \qquad (1)$$

In other words, it is considered that the life time is consumed 100% when the sum of gradual consumptions of the inherent life time of the gate oxide film (e.g., 2%, 3% ...) reaches "1," i.e., when the sum of the minute periods Δt.

A safety coefficient S may be included considering guarantee of the reliability. In this case, "1" in the right side of the equation (1) is replaced with 1/S. Alternatively, "1" in the right side of the equation (1) may be replaced with a value which is inherent to the material.

Further, the life time of an element of a semiconductor S device may not necessarily be a time until breakdown. For instance, when charges of a quantity Q are implanted into a gate oxide film, determining by experience that the gate oxide film is not usable even if breakdown of the gate oxide film itself has not yet occurred, a time at which the gate oxide film is judged as not usable may be defined as the life time tBD. This is also the same with evaluation of EM described later.

Still further, the sum of the effective life consumption ratios each calculated by dividing the value $j(t)\Delta t$ by the charge-to-breakdown QBD is mathematically identical to the sum of values $\Delta t/tBD(J)$ each calculated by dividing the minute period $\Delta t$ by the life time $tBD(J)$ as it is with the constant current J flowing. That is, since $j(t)/QBD(J)=1/tBD(J)$ in the equation (1), the following equation (2) may be used:

$$\Sigma\{\Delta t/tBD(J)\}=1 \quad (2)$$

Figure 7:
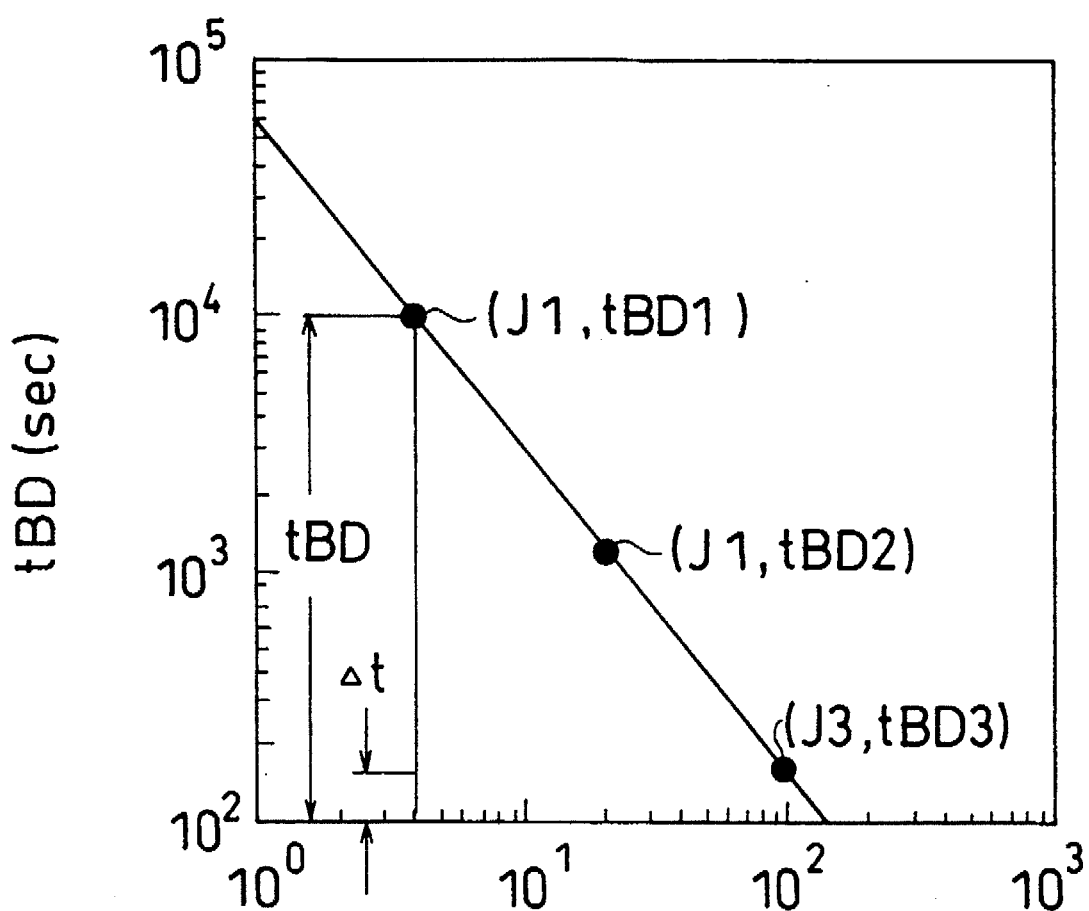
FIG. 7 is a view showing a relationship between a breakdown time tBD and a current value in a test utilizing an implanted constant current.

In this case, the sum is easily calculated using a tBD-J characteristic shown in FIG. 7 as described later. The tBD-J characteristic is obtained from a relationship between the constant current densities J1, J2 . . . and the corresponding breakdown times tBD1, tBD2 . . . shown in FIG. 4. Assuming that the life time tBD corresponding to the constant current density 4 (mA/cm$^2$) shown in FIG. 7 is consumed by $\Delta t$ during the minute period $\Delta t$ which is defined as $t-t+\Delta t$ in FIG. 4, for example, calculation in this manner is exactly the same as the calculation which uses the charge-to-breakdown QBD as a parameter.

By the way, it is necessary to find the time-sequence change j(t) in the current density during application of a predetermined voltage to presume the life time tBD of the gate oxide film during application of a constant voltage from the equation (1). In the following, a method of determining j(t) will be described, taking presumption of the life time of a gate oxide film as an example.

The current density j is a function of the time t because application of a voltage onto a gate oxide film from outside creates a defect such as trapping of electrons in the gate oxide film and the gate oxide film itself deteriorates with time. The current density J(t) which deteriorates with time is calculated based on an initial trapping speed in the gate oxide film, a capture cross section of the trap in which electrons are trapped, the speed at which a new trap is created in the gate oxide film, a capture cross section of the new trap in which electrons are trapped and positions at which electrons are trapped, according to published literature (I.-C. Chen et al., IEEE Trans. On Electron Devices, vol. ED-32, No. 2, 1985, p. 413; hereinafter "literature 1"). This is confirmed in an embodiment which shows the validity of this model as described later.

To be specific, the current density is calculated by the following basic equation. A Flowler-Nordheim characteristic of a gate oxide film is expressed by the equation (3) below:

$$J=AF^2 \cdot \exp(-B/F) \quad (3)$$

The speed nt at which trapped electrodes are generated is expressed by the equations (4) to (6) as follows:

$$nt=np+ng \quad (4)$$

$$dnp/dt=\{j(t)/e\}\cdot\sigma\cdot(N_{pt}-np) \quad (5)$$

$$dng/dt=\{j(t)/e\}\cdot\sigma g\cdot\{\int(G\cdot j(t)/e)\,de-ng\} \quad (6)$$

In the equation (6), "∫" expresses an integral calculus from 0 to t. Further, a decrease in an effective electric field in the gate oxide film due to trapped electrons is expressed by the equation (7) below:

$$F=(Vg/tox)-(e\cdot nt/\epsilon o\ \epsilon ox)\{1-(\chi/tox)\} \quad (7)$$

In the equations (3) to (7) above, the letters A and B are constants, the letter F is a electric field in the gate oxide film (MV/cm), the symbol nt is the density of all trapped electrons (cm$^{-2}$), the symbol np is the density of old trapped electrons, the symbol ng is the density of trapped electrons newly generated, the symbol $N_{pt}$ is the precedent trapping density, the symbol σ is the capture cross section of a trap ($N_{pt}$), the symbol σg is the capture cross section of the new trap, the letter g is the trap generation rate, the symbol Vg is the voltage applied to a gate electrode (V), the symbol tox is the thickness of the gate oxide film (cm), the symbol εo is the insulation ratio measured in vacuum, the symbol εox is the insulation ratio the gate oxide film (SiO2), and the symbol χ is the trap centroid (cm). Of these parameters, the three parameters A, B and $N_{pt}$ are parameters which have a dependency on a condition of forming the gate oxide film and the quality of the film. Other parameters have known values.

Under the condition that the thickness of the gate oxide film tox is 8 nm and gate voltages are 9.8 V and 11.2 V at points a and b in FIG. 4 at which gate currents are 4 mA and 20 mA, the parameters A and B are calculated from the equation (3), whereby j(0) is determined. Under this condition, $A=5.2\times10^{-6}$, $B=3.2\times10^8$ and $N_{pt}=2.5\times10^{12}$.

Next, after $\Delta t$ from the time t=0, the equations (4) and (5) are:

$$np\,(\Delta t)=\sigma\,\{j(0)/e\}\,\{N_{pt}-np(0)\}$$

$$np\,(\Delta t)=\sigma g\,\{j(0)/e\}\cdot\{(G/e)\,j(0)\,\Delta t-ng(0)\}$$

where np(0)=ng(0)=0. Substituting these equations in the equation (7), $$F(\Delta t)=(Vg/tox)-(e\cdot nt\,(\Delta t)/\epsilon o\ \epsilon ox)\cdot\{1-(\chi/tox)\}$$

Hence, j($\Delta t$) is calculated from the equation (3).

Following this, the equations (4) and (5) after the minute period $2\Delta t$ are:

$$np\,(2\Delta t)=\sigma\{j(\Delta t)/e\}\,\{N_{pt}-np(\Delta t)\}$$

$$np\,(2\Delta t)=\sigma g\,\{j(\Delta t)/e\}\cdot[(\Delta t/e)\,\{Gj(0)+Gj(\Delta t)-ng(\Delta t)\}$$

Substituting these equations in the equation (7), $$F(2\Delta t)=(Vg/tox)-\{e\cdot nt\,(2\Delta t)/\epsilon o\ \epsilon ox\}\cdot\{1-(\chi/tox)\}$$

The value j(2$\Delta t$) is then calculated from the equation (3).

Further, the equations (4) and (5) after the minute period $3\Delta t$ are:

$$np\,(3\Delta t)=\sigma\,\{j(2\Delta t)/e\}\cdot\{N_{pt}-np(2\Delta t)\}$$

$$np\ (3\Delta t){=}\sigma_g\ \{j(2\Delta t)/e\}\cdot[(\Delta t/e)\ \{Gj(0){+}Gj(\Delta t){+}Gj(2\Delta t)\}{-}ng(\Delta t)]$$

Substituting these equations in the equation (7), $$F(3\Delta t){=}(Vg/tox){-}\{e\cdot nt\ (3\Delta t)/eo\ tox\}\cdot\{1{-}(\chi/tox)\}$$

The value j(3Δt) is then calculated from the equation (8).

In short, the values j(0), j(Δt), j(2Δt), j(3Δt) . . . are determined serially, thereby eventually obtaining the curve j(t) as that shown in FIG. 5.

Figure 11:
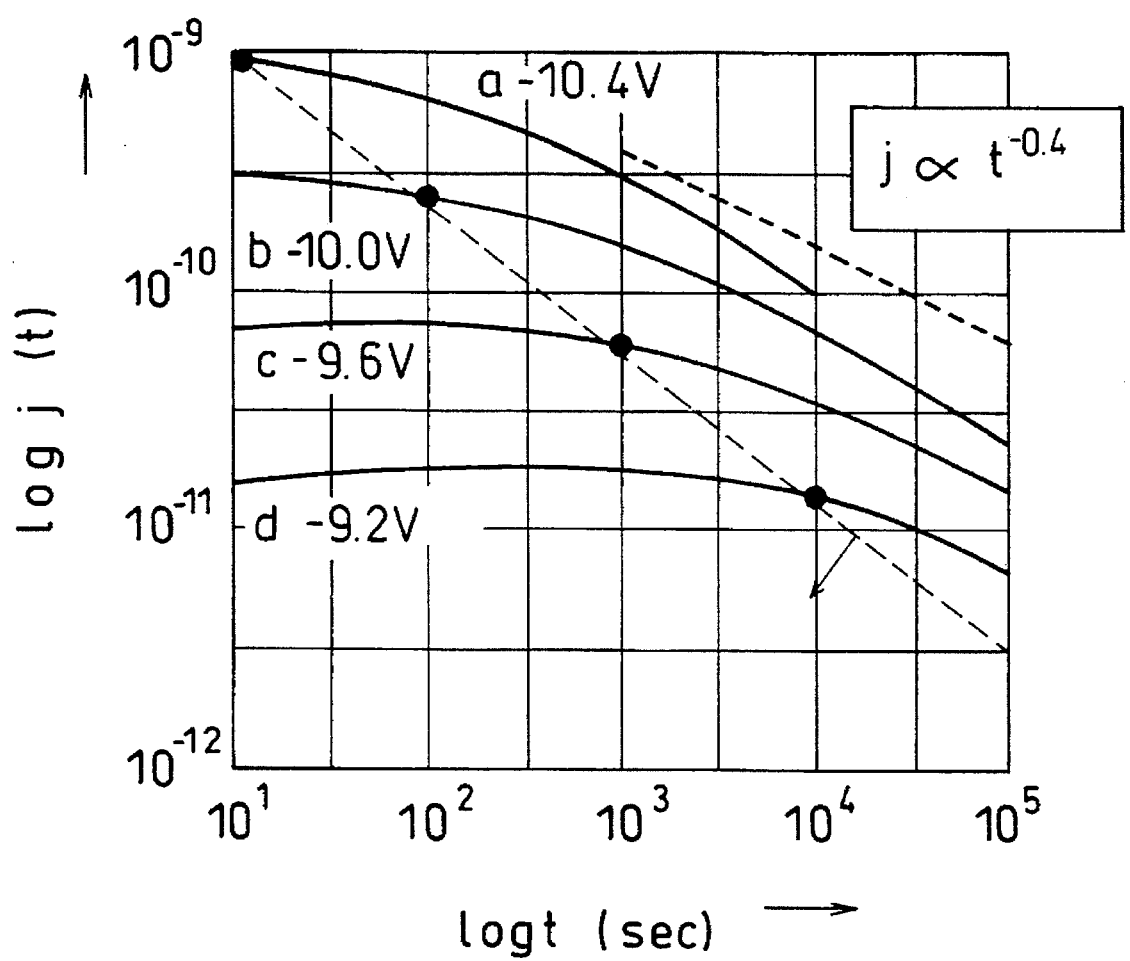
FIG. 11 is a view showing a relationship between a current density and time marked in log along a vertical and a horizontal axes.

Further, it was found that the current density j(t) is approximated as follows. That is, as shown in FIG. 11, it was confirmed by an experiment that the current density j(t) has a dependency of $t^{-0.4}$ on the time t. FIG. 11 shows the time-sequence change in the current density of FIG. 5 during four stepwise changes in a constant applied voltages from −10.4 V, −10.0 V, −9.6 V to −9.2 V, marking log numbers of the current density j(t) along a vertical axis and log numbers of the time t along a horizontal axis. The current densities j(t), although depending on the applied voltage, are approximately constant during an initial stage until intersecting the dotted line in FIG. 11 (for about 100 sec for the applied voltage of −10.0 V, about 1000 sec for the applied voltage of −9.6 V, 10000 sec for the applied voltage of −9.2 V) and are approximately in proportion to $t^{-0.4}$ after intersecting the dotted line. The characteristic shown in FIG. 11 is obtained on a sample gate oxide film which has a gate area of 5 μm² and a thickness of 8 nm. The characteristic remains similar on other samples as well.

Hence, as described later, it is possible to presume the current density j(t) extremely fast and easily utilizing this result.

If necessary, the dependency of the charge-to-breakdown QBD on the constant current density J expressed by the equation (1) can be calculated in a shorter time than by evaluating utilizing an applied constant voltage. For example, calculation completes well within a period on the order of $10^4$ sec as shown in Table 1 in the case of 3-point measurement.

Thus, calculating the charge-to-breakdown QBD(J) in advance in a test utilizing a constant current and substituting the calculated charge-to-breakdown QBD in the equation (1), the reliability life time of a gate oxide film is presumed quantitatively and accurately in a shorter time than in the conventional techniques.

Now, in accordance with this model, life time presumption methods according to preferred embodiments will be described.

FIRST PREFERRED EMBODIMENT

Figure 1:
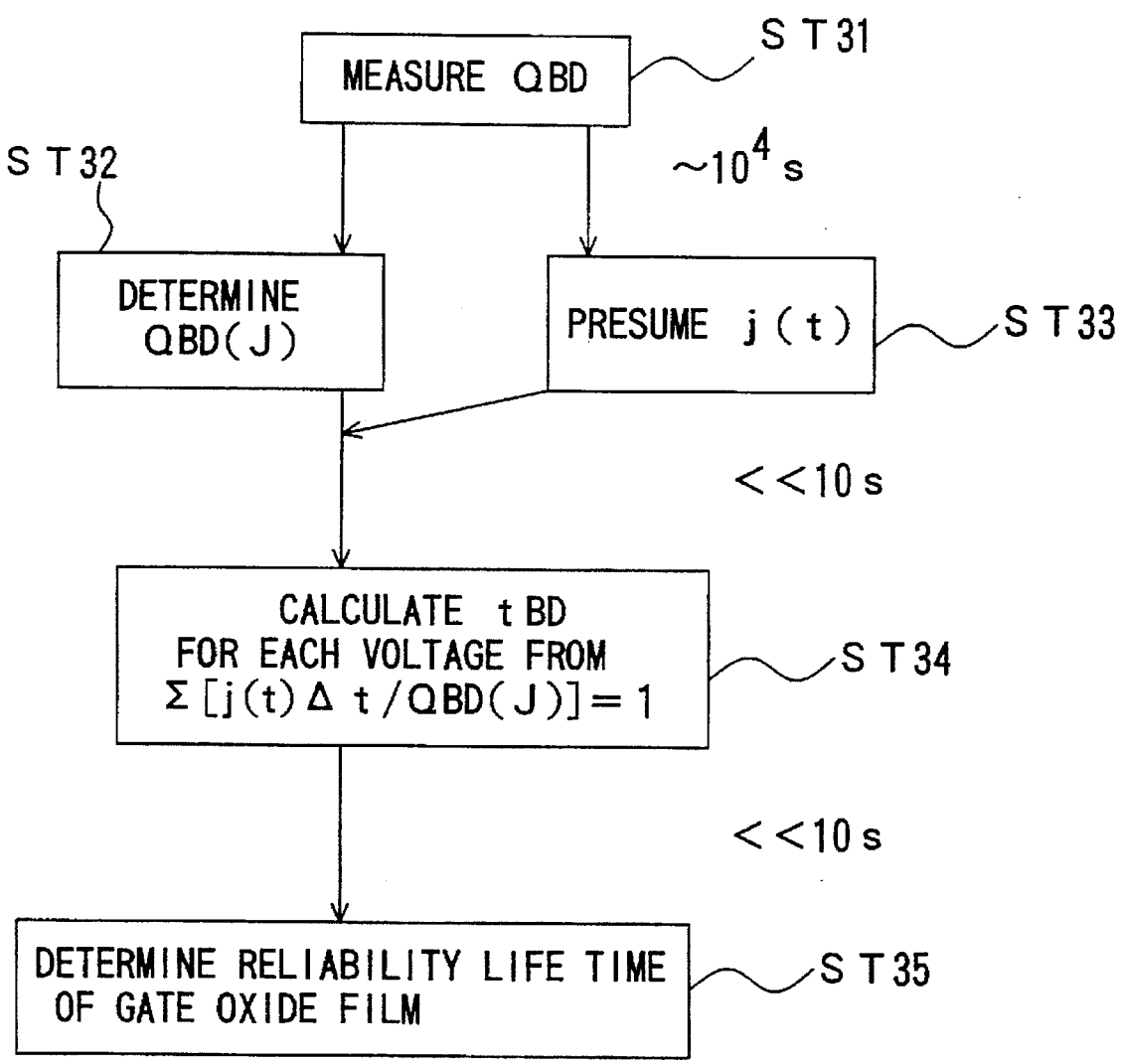
FIG. 1 is a flow chart showing a sequence of life time presumption using a charge-to-breakdown as a parameter to judge the life time of a gate oxide film.

FIG. 1 is a flow chart showing a basic sequence of presuming the life time of a gate oxide film in accordance with the model described above.

First, at Step ST31, a few different constant currents J1, J2 . . . i.e. a first electric stress, are implanted into a gate oxide film, and a time tBD (sec) until breakdown and a time-sequence change Vg (t) in the gate voltage Vg until breakdown of the gate oxide film are measured. That is, the change Vg (t) in the gate voltage Vg with respect to the time t in response to the current values J1, J2 . . . as shown in FIG. 4 and the quantities of charges (charge-to-breakdown) QBD1, QBD2 and QBD3 implanted until breakdown are measured.

Next, at Step ST32, the dependency of the charge-to-breakdown QBD on the constant current density J as shown in FIG. 3, i.e., QBD(J) is determined. On the other hand, at Step ST33, a change in the current density j with the stress time t during application of the constant voltage as shown in FIG. 5, i.e., j(t) is presumed in the sequence using the equations (3) to (7) described above.

Next, at Step ST34, the effective life consumption ratios during the respective minute periods Δt are accumulated based on the equation (1) above, thereby calculating the sum of the respective minute periods Δt, i.e., the life time tBD until the value reaches "1" is calculated.

At a proper safety coefficient 1/S is multiplied or other calculation is conducted at Step ST35 to determine the reliability life time of a gate oxide film.

Since most of the time required for evaluation is a time needed for measurement of the charge-to-breakdown QBD (J) and this measurement is performed by implanting a constant current into the gate oxide film in the method shown in FIG. 1, this method reduces an evaluating time to about 1/10 of that required in the conventional test utilizing a constant voltage as shown in Table 1 although the testing method well expresses the actual use.

SECOND PREFERRED EMBODIMENT

Figure 6:
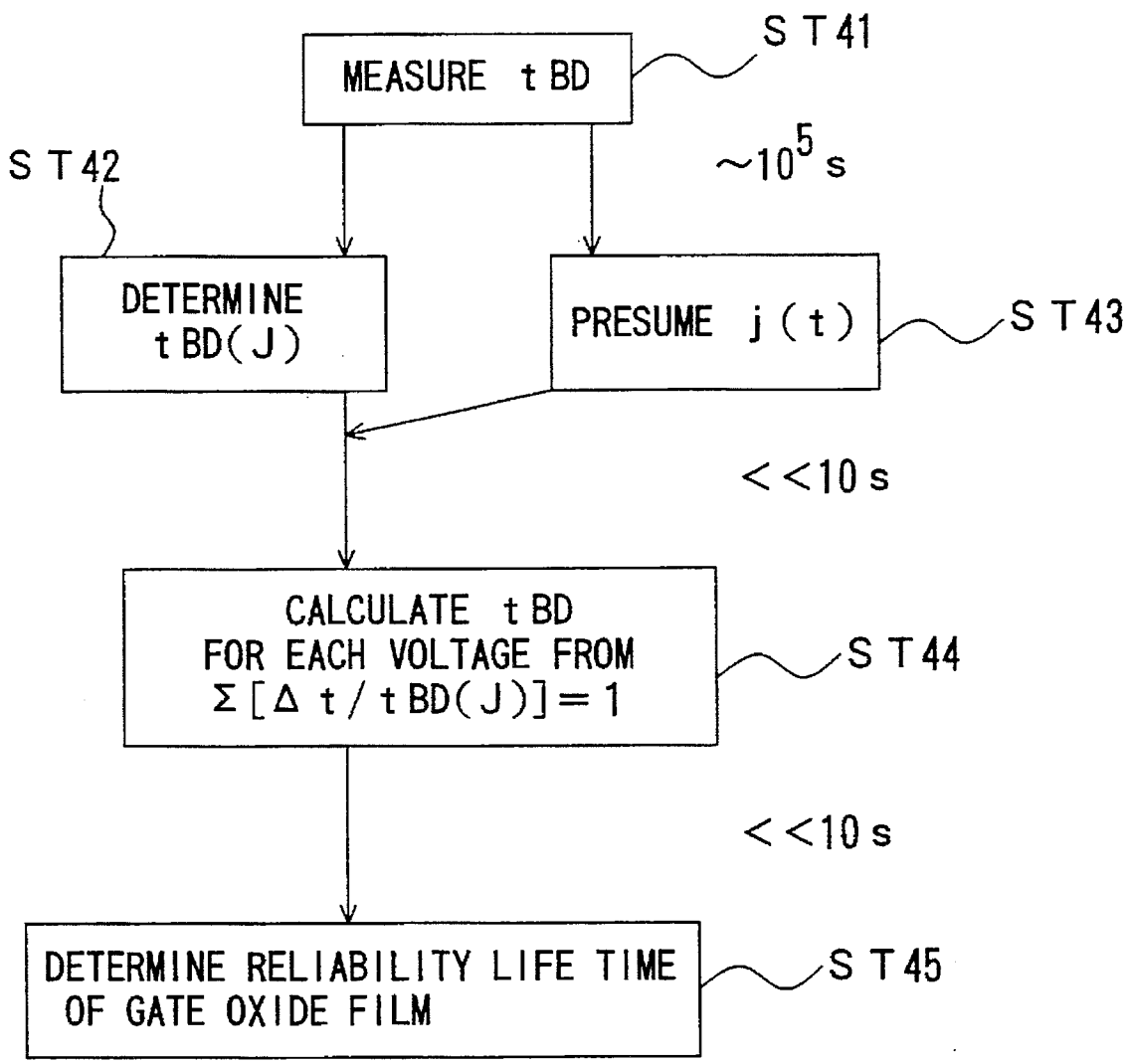
FIG. 6 is a flow chart showing a sequence of life time presumption using a breakdown time as a parameter to judge the life time of a gate oxide film.

FIG. 6 is a flow chart showing presumption in which the life time of a semiconductor device is presumed directly from the life time tBD which is obtained during application of a constant current without calculating the charge-to-breakdown QBD.

First, the breakdown times tBD1, tBD2 . . . corresponding to the constant current densities J1, J2 . . . and the Vg(t) characteristic shown in FIG. 4 are measured at step ST41.

Next, at step ST42, tBD(J) shown in FIG. 7 is determined from a result of measurement obtained at step ST41. At the same time, the j(t) characteristic is calculated by the equations (3) to (7) at Step ST43.

Next, utilizing the j(t) characteristic with respect to the constant voltage and the tBD-J characteristic shown in FIG. 7, the sum Σ{Δt/tBD(J)} of the effective life consumption ratios during the respective minute periods Δt is calculated at Step ST44. The sum tBD of the respective minute periods Δt until the value reaches "1" is calculated.

Following this, at Step ST45, a proper safety coefficient 1/S is multiplied on the life time tBD to determine the reliability life time of the gate oxide film.

THIRD PREFERRED EMBODIMENT

Now, a third preferred embodiment will be described. In the present embodiment, a description will be given on a model of a method of evaluating EM.

Figure 9:
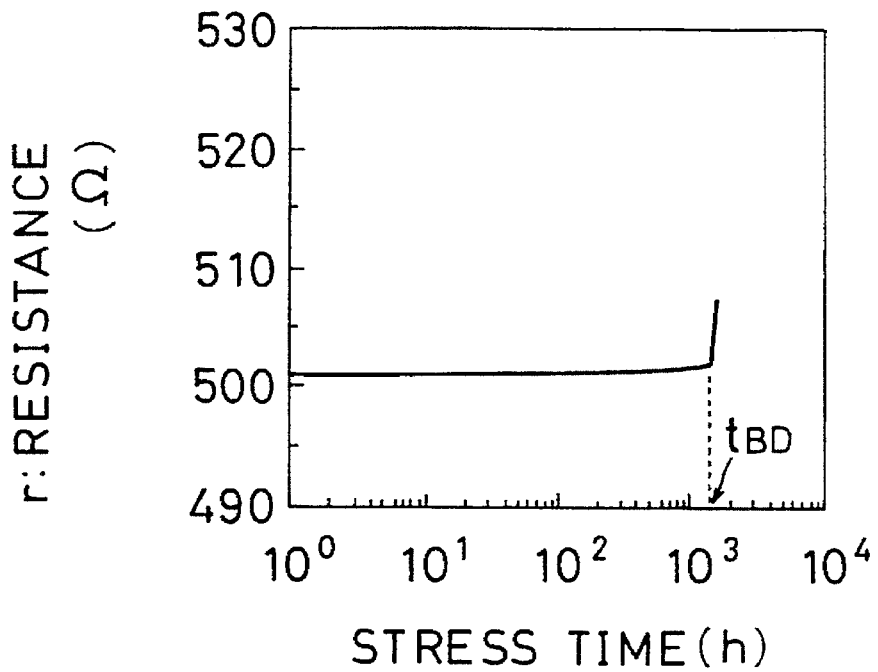
FIG. 9 is a view showing a change in a resistance of a metal wire with time when a constant current is applied.
Figure 10:
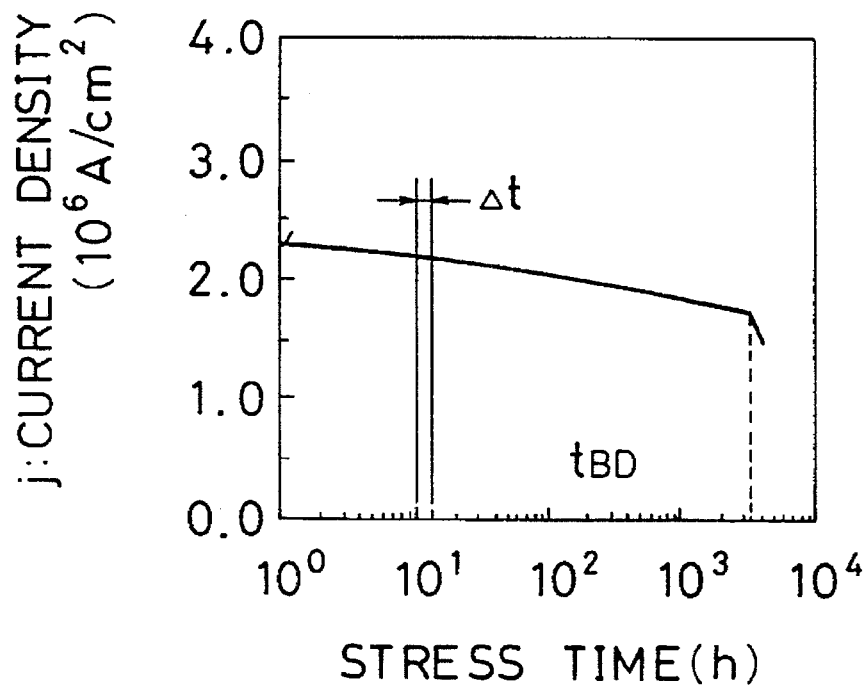
FIG. 10 is a view showing a change in a current value of a metal wire with time when a constant voltage is applied.

During evaluation of EM as well, a model similar to that described above regarding breakdown of a gate oxide film is considered. Now, as shown in FIG. 9, a time until breakdown (fracture) with the constant current J applied is defined as tBD. In evaluation of EM, the dependency of the breakdown time tBD on the current density J is expressed by the equation (8) below:

$$tBD{=}A{\times}J^{(-n)}{\times}\exp\ (E/kT) \qquad (8)$$

where the symbol n is an exponent which is usually "2," the symbol E is activation energy and the symbol T is a substrate temperature.

On the other hand, the time-sequence change j(t) in the current density j of a current which flows in a metal wire during application of the constant voltage is as shown FIG.

10. That is, the value j(t) very gradually decreases from implantation of the current and then abruptly decreases before breakdown. Hence, the current density j(t) during each minute period Δt is approximated to the constant value J and the constant value J is substituted in the equation (8), whereby the breakdown time tBD (hereinafter "t(J)") is determined. The accumulation value of the effective life consumption ratios Δt/tBD(J) is then calculated by the equation (2). As a result, the life time tBD with the constant current applied is presumed.

Figure 8:
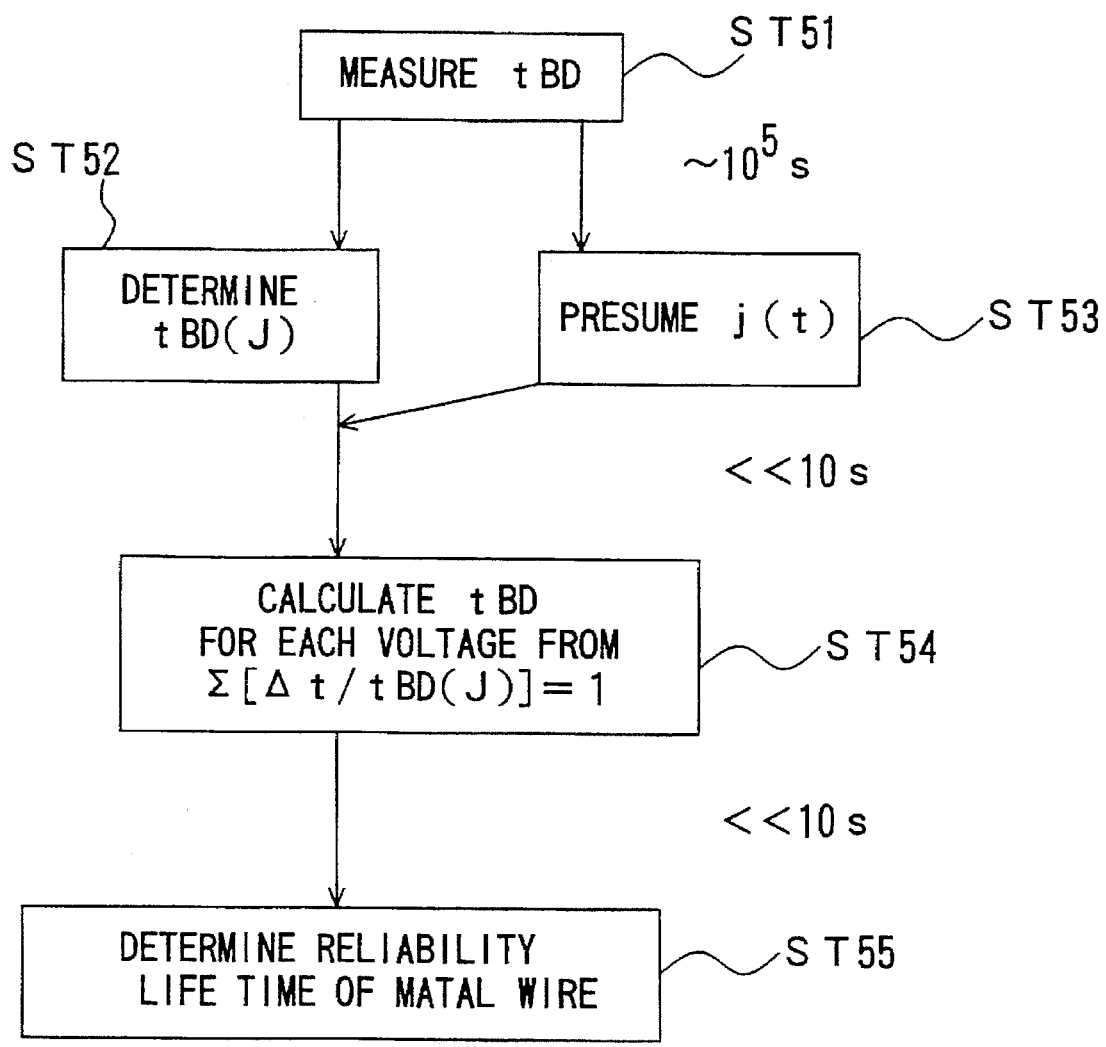
FIG. 8 is a flow chart showing a sequence of life time presumption using a breakdown time as a parameter to judge the life time of a metal wire.

FIG. 8 shows a sequence of determining the reliability life time of a metal wire. At Step ST51, a constant current is implanted, a time-sequence change r(t) in a resistance value r shown in FIG. 9 is measured and the life time tBD is determined as a time until an abrupt increase in the resistance value r.

Next, the result of the measurement is substituted in the equation (8) at Step ST52, thereby calculating the coefficient A and determining the dependency tBD(J) of the life time tBD on the current J. At the same time, the time-sequence change j(t) in the current density j during application of the constant voltage is presumed at Step ST53. At Step ST54, the effective life consumption ratios {Δt/tBD(J)}, with respect to the respective voltages are accumulated, and a time when the accumulation value reaches "1" is defined as the life time tBD.

Further, at Step ST55, a proper safety coefficient 1/S is multiplied on the life time tBD to determine the reliability life time of the gate oxide film.

FOURTH PREFERRED EMBODIMENT

Figure 12:
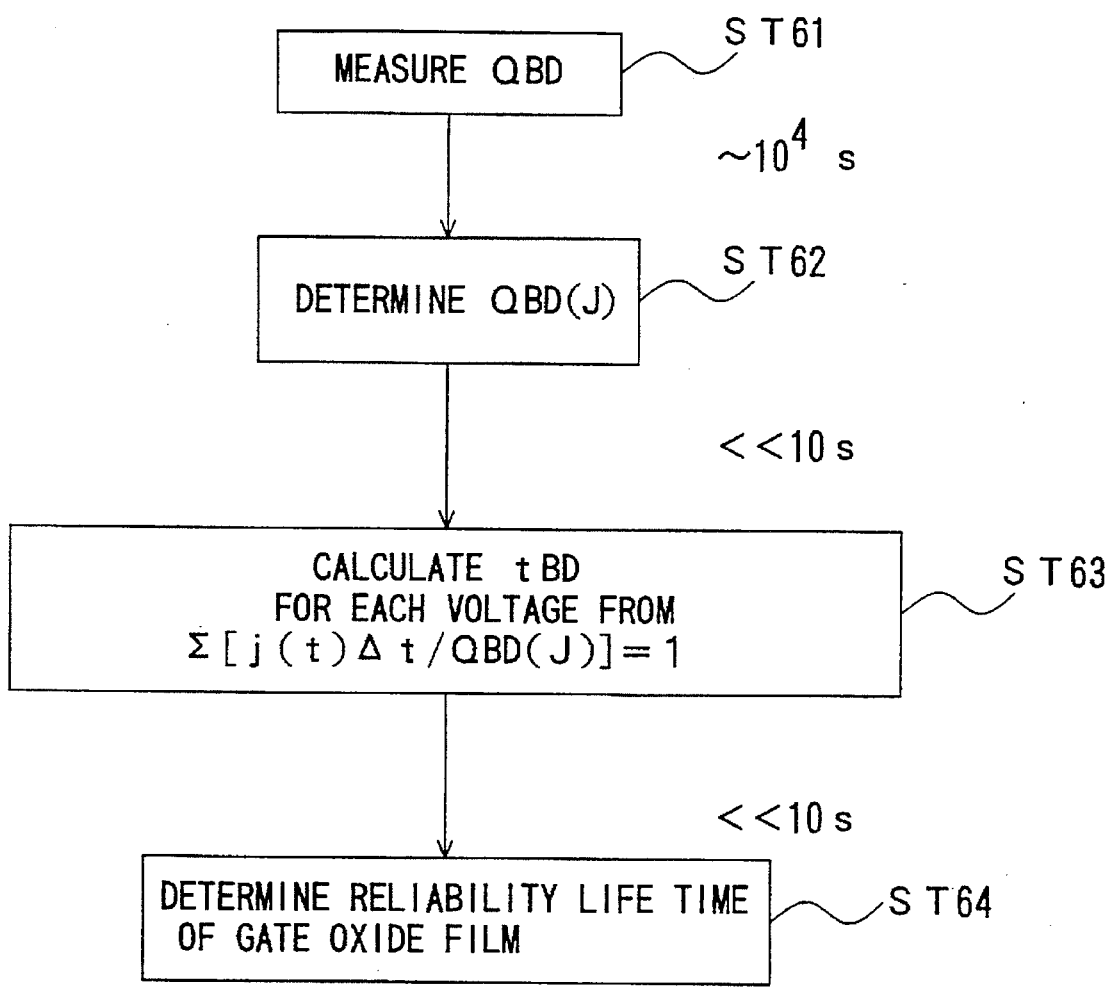
FIG. 12 is a flow chart showing a sequence of life time presumption using a charge-to-breakdown as a parameter to judge the life time of a gate oxide film, approximating a time-sequence change in a current density.

FIG. 12 is a flow chart of life time presumption in which the current density j(t) is determined by approximation utilizing the characteristic shown in FIG. 11 and the current density j(t) is used to presume a life time.

In this case, the current density j(t) is constant until a predetermined time period passes, and then approximated as follows:

$$j(t)=k \times t^{-0.4}$$

Life time presumption is performed in accordance with the sequence starting from Step ST61 to Step ST64 in this case. This sequence is the same as that shown in FIG. 1 except for omission of Step ST33. That is, since the constant k is determined from a relationship between the parameters J and V during calculation of the charge-to-breakdown QBD at Step ST61, the relationship shown in FIG. 11 is also determined. As a result, the life time is immediately presumed from the equation (1). Hence, the present embodiment does not need the process at Step ST33 of FIG. 1, which greatly simplifies the life time presumption.

EXAMPLES OF EXPERIMENT

First Example of Experiment

Now, examples of experiment utilizing the model described above will be described. First, an apparatus for presuming the life time of a semiconductor device and a presumption method used in the first experiment will be described while referring to associated drawings.

Figure 13:
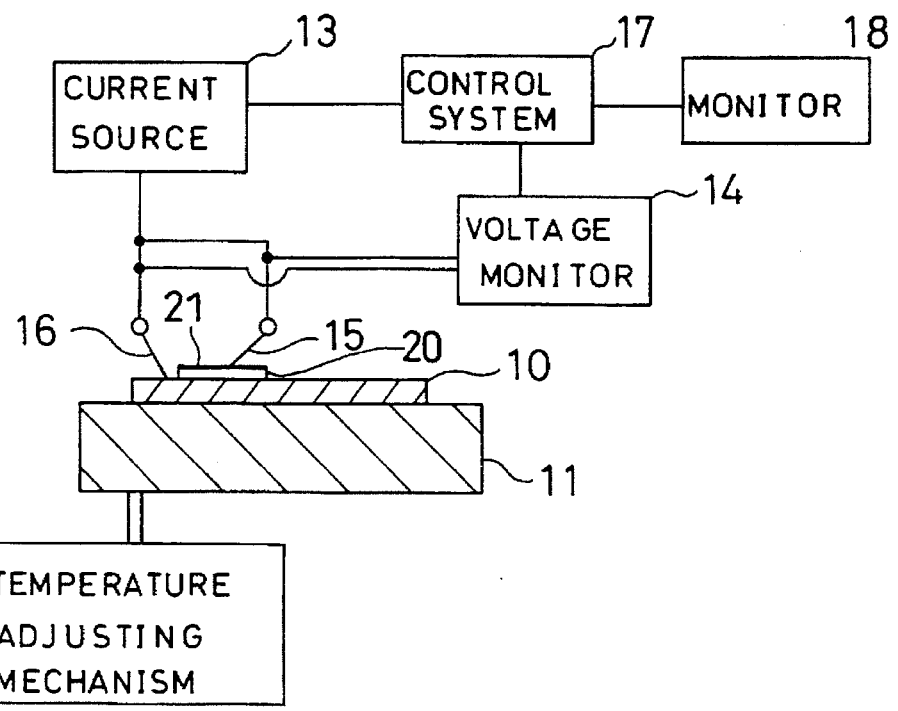
FIG. 13 is a schematic view showing a cross section of a semiconductor device used in life time presumption and a structure of an apparatus for presuming the life time of the semiconductor device according to a first preferred embodiment.

In FIG. 13, the respective symbols denote the following elements. Denoted at 10 is a semiconductor substrate, denoted at 20 is a gate oxide film which is formed on the semiconductor substrate 10, denoted at 21 is a gate electrode which is formed on the gate oxide film 20. The semiconductor substrate 10, the gate oxide film 20 and the gate electrode 21 form a MOS capacitor. The surface area of the gate electrode 21 is 5 μm² and the thickness of the gate oxide film 20 is 8 nm. Denoted at 11 is a wafer stage, denoted at 12 is a temperature adjusting mechanism for adjusting a temperature of the wafer stage, denoted at 13 is a current source, denoted at 14 is a voltage monitor, denoted at 15 is a probe for applying a current to the gate electrode 21, denoted at a 16 is a probe for grounding the semiconductor substrate 10, denoted at 17 is a control system which stops implantation of a current when detecting breakdown of the gate oxide film 20, and denoted at 18 is a monitor. The semiconductor substrate 10 may be grounded from the wafer stage 11 side.

First, in accordance with the sequence shown in the flow chart in FIG. 1, the current source 13 implanted a constant current into the gate electrode 21 which was formed on the semiconductor substrate 10 in which the MOS capacitor was created. Three different current densities, 4 mA/cm², 20 mA/cm² and 100 mA/cm² were implanted. A gate voltage onto the gate oxide film of the MOS capacitor was plotted against time using the voltage monitor 14, to thereby measure the charge-to-breakdown QBD. This relationship is shown in FIG. 3. Assuming that the relationship QBD(J) between the charge-to-breakdown QBD and the constant current density J is expressed by the equation (9) below, $$QBD(J)=K1-K2 \ln J(t) \qquad (9)$$

K1=52.2 and K2=8.21.

Utilizing a time-sequence change in the gate voltage Vg which is monitored concurrently with measurement of the charge-to-breakdown QBD (i.e., the gradient of the voltage-time characteristic), the speed at which a new trap is created in the gate oxide film is calculated. From the dependency of the charge-to-breakdown QBD on the constant current density J and the respective parameters regarding the gate oxide film, the equations (3) to (7) yield the time-sequence change j(t) of the current density j during application of the constant voltage. Further, life time presumption is performed using the equation (1) and assuming that the voltage applied during actual use is 10 MV/cm.

Figure 14:
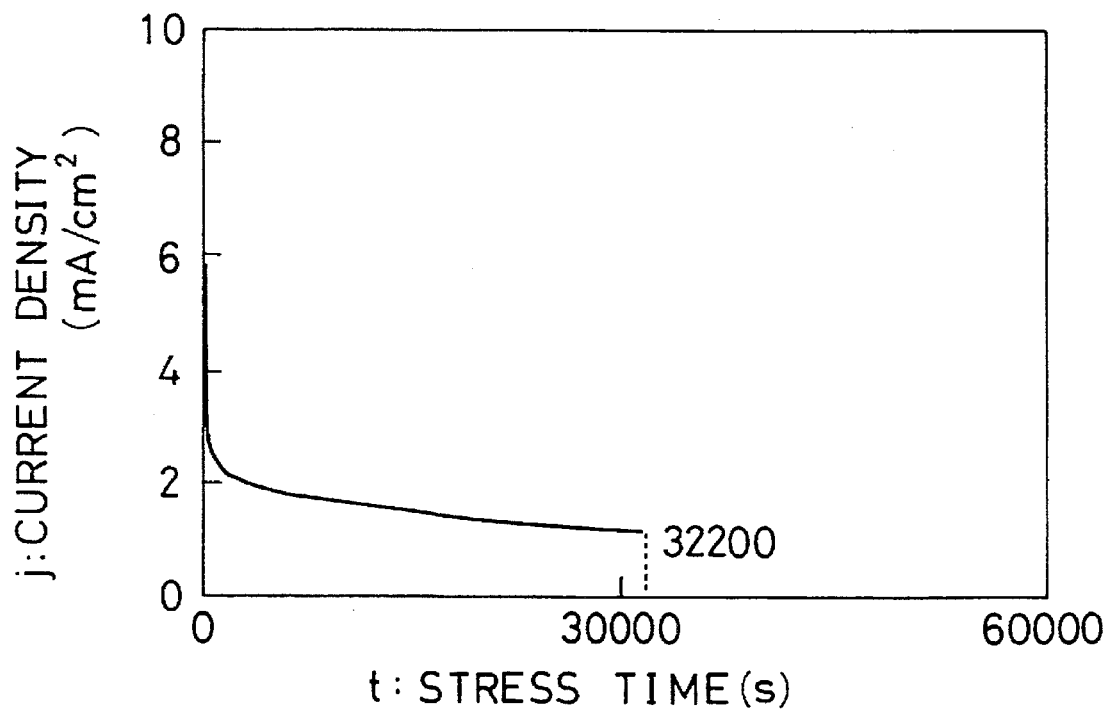
FIG. 14 is a view showing a calculated time-sequence change in a density of a current which flows in a gate oxide film during application of a constant voltage.

FIG. 14 shows a time-sequence change in a calculated gate current during application of the constant voltage. Table 2 shows parameters used in calculation. The equations disclosed in the literature 1 were used as basic equation used in calculation.

TABLE 2

|  | Thickness of Gate Oxide Film (nm) 8 |
| --- | --- |
| $N_{pt}$ ($10^{12}$ cm$^{-2}$) | 2.5 |
| g ($10^{-9}$) | 5.0 |
| σ ($10^{-19}$ cm$^2$) | 1.0 |
| $σ_p$ ($10^{-18}$ cm$^2$) | 1.0/j [mA/cm²] |

In Table 2 above, the symbol $N_{pt}$ is the existing trapping density, the symbol g is the trap generation rate, the symbol σ is the capture cross section of the existing trap, and the symbol σp is the capture cross section of the new trap.

As a result, the life time of the gate oxide film was presumed to be 3.22×10⁴ (sec) when used with a voltage of 10 MV/cm. This value is approximately the same as the life time measured using an applied constant voltage (3.47×10⁴ (sec)). In addition, the life time of the gate oxide film when used with an applied electric fields of 9 MV/cm and 10

MV/cm was presumed to be $1.15 \times 10^5$ (sec) and $6.00 \times 10^6$ (sec), respectively. Therefore, the life time of hundred years is guaranteed for actual use of the semiconductor device. The evaluation above took about four hours, reducing the evaluating time to about $1/10$ of about forty hours needed in the conventional methods which use an applied constant voltage. The results of the evaluation are accurate, almost equal to those yielded by the conventional methods.

By performing a temperature accelerated test in the method above if necessary, the evaluating time is largely reduced although the accuracy of measurement results deteriorates. According to the experiment conducted in relation to the present embodiment, the activation energy which determines an acceleration coefficient was 0.155 eV and the evaluating time was about $1/3$ of the evaluating time needed according to the present experiment.

If a safety coefficient is 2, the presumed life time is $1.05 \times 10^4$ (sec). Thus, presumption considering a safety coefficient is also possible.

Second Example of Experiment

In a second experiment, the life time was presumed in accordance with the flow chart in FIG. 12 using an adjusted sample which was similar to that used in the first experiment described above.

First, the current source 13 implanted a constant current into the gate electrode 21 which was formed on the semiconductor substrate 10 in which the MOS capacitor was created. Three different current densities, 4 mA/cm², 20 mA/cm² and 100 mA/cm² were implanted. A gate voltage upon the gate oxide film of the MOS capacitor was plotted against time using the voltage monitor 14, to thereby measure the charge-to-breakdown QBD. This relationship is shown in FIG. 3 as in the first experiment. Assuming that the relationship QBD(J) between the charge-to-breakdown QBD and the constant current density J is expressed by the equation below, $$QBD(J) = K1 - K2 \, \ln J(t) \qquad (9)$$

K1=52.2 and K2=8.21.

Further, based on the result shown in FIG. 11, the life time j(t) was presumed assuming that the applied voltage was −10.0 V as follows:

| | |
|---|---|
| $j(t) = j(0)$ | (1 < 100 sec) |
| $j(t) = j(0) \times (t/100)^{-0.4}$ | (t > 100 sec) |

The value j(0) was obtained during measurement of the value QBD.

As a result, the life time of the gate oxide film was presumed to be $3.71 \times 10^4$ (sec) when used with a voltage of −10.0 V. This value is approximately the same as the life time measured using an applied constant voltage ($3.47 \times 10^4$ (sec)). In addition, the life time of the gate oxide film when used with applied electric fields of −9.6 V and −9.2 V were calculated by setting the value j(t) as below:

When the applied voltage is −9.6 V,

| | |
|---|---|
| $j(t) = j(0)$ | (1 < 1000 sec) |
| $j(t) = j(0) \times (t/1000)^{-0.4}$ | (t > 1000 sec) |

When the applied voltage is −9.2 V,

| | |
|---|---|
| $j(t) = j(0)$ | (1 < 10000 sec) |
| $j(t) = j(0) \times (t/10000)^{-0.4}$ | (t > 10000 sec) |

With such setting, the life time with the applied voltage of −9.6 V was presumed to be $1.33 \times 10^5$ sec and the life time with the applied voltage of −9.2 V was presumed to be $70 \times 10^6$ sec. Therefore, the life time of hundred years is guaranteed for actual use of the semiconductor device as in the first experiment. The evaluation above took about three hours and a half, reducing the evaluating time to $1/10$ of or less than about forty hours needed in the conventional methods which use an applied constant voltage. The results of the evaluation are accurate, almost equal to those yielded by the conventional methods. In other words, the life time presumption according to the present experiment is simpler than that in the first experiment, and therefore, is advantageous because of further reduction in the evaluating time.

By performing a temperature accelerated test in the method above if necessary, the evaluating time is largely reduced although the accuracy of measurement results deteriorates. As in the first experiment, the activation energy which determines an acceleration coefficient was 0.155 eV and the evaluating time was about $1/3$ of the evaluating time needed according to the present experiment.

If a safety coefficient is 2, the presumed life time is $1.86 \times 10^4$ (sec). Thus, presumption considering a safety coefficient is also possible.

Third Example of Experiment

A third experiment will be described while referring to the associated drawing.

Figure 15:
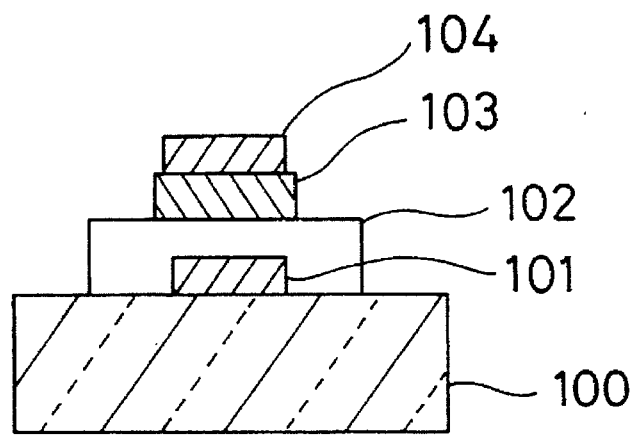
FIG. 15 is a schematic cross sectional view showing a structure of a TFT which is used in a second preferred embodiment.

In the present experiment, the life time of a TFT which is used in a liquid crystal display panel shown in FIG. 15 was evaluated. An apparatus used for evaluation was similar to the apparatus of FIG. 13. In FIG. 15, denoted at 100 is a glass substrate, denoted at 101 is a gate electrode, denoted at 102 is a gate oxide film (100 nm), denoted at 103 is an amorphous silicon film which functions as a semiconductor, and denoted at $10^4$ is an n⁺ amorphous silicon film which functions as a conductive element.

First, a constant current is implanted into the gate oxide film 102. Three different current densities, 0.1 mA/cm², 1 mA/cm² and 10 mA/cm² were implanted. The gate voltage Vg applied on the gate oxide film 102 was plotted with respect to time, thereby measuring the charge-to-breakdown QBD. Assuming that the applied voltage was 3 MV/cm, the life time was presumed from the relationship between the constant current density J and the charge-to-breakdown QBD and using the equation (8), in procedure which is similar to that for the first experiment.

As a result, the life time of the gate oxide film 102 of the TFT with the voltage of 3 MV/cm was presumed to be $1.50 \times 10^3$ (sec). This value is approximately the same as the life time measured using an applied constant voltage ($1.61 \times 10^3$ (sec)) or the like. It was also confirmed that presumed values were the same as measurements with an error of about ±10% when the voltage is 2 MV/cm. The presumption took about 300 sec, which is about 20% of the actual time required.

Fourth Example of Experiment

A fourth experiment will be described while referring to the associated drawing.

Figure 16:
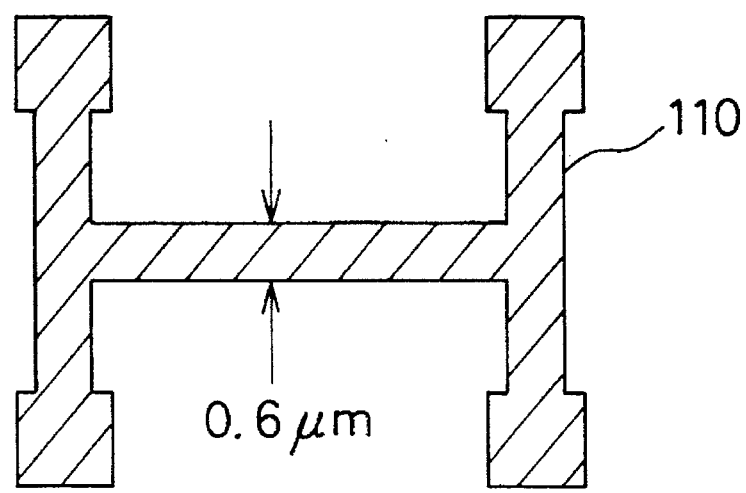
FIG. 16 is plan view showing a pattern of a wire which is used in a third preferred embodiment to evaluate EM.

FIG. 16 is a plan view showing a pattern of a wire used to evaluate EM. A metal wire 110 is made of Al-Si-Cu and has a thickness of 500 nm and a width of 0.6 μm. A temperature of a substrate is set at 100° C.

In the present experiment, a constant current J of a current density of $2.0 \times 10^5$ (A/cm$^2$) was implanted into the metal wire 110 in accordance with the flow chart in FIG. 8. A time tBD until breakdown of the metal wire 110 (i.e., a time required for a resistance value to abruptly increase) was then measured as shown in FIG. 9. The relationship between the value tBD and the value J was obtained from the equation (8). (Activation energy was set as 0.6 eV).

Next, a time-sequence change in a current value with a constant voltage applied was calculated. From the results of the experiments according to the present invention, it is known that the current j and the time t holds the following relationship:

$$j = j0 - B \times \ln t$$

As a result of life time presumption assuming that the applied voltage was 0.3 V, this value was calculated as $4.20 \times 10^3$ (h). This value is approximately the same as the life time which is presumed with the constant voltage applied ($3.9 \times 10^3$ (h)). This method allows to introduce the heretofore impossible concept of the life time as it is during application of an applied constant voltage which is close to that during device operations, making it possible to presume the life time accurately in a short time.

What is claimed is:

1. A method of presuming the life time of a semiconductor device in which a time from application of an electric stress including a current and a voltage onto an element of the semiconductor device until said element becomes unusable is measured and thereafter the life time of the semiconductor device is presumed with a second electric stress applied while utilizing a test in which a first electric stress is applied, said method comprising:

a first step of implanting a constant first electric stress having a plurality of values into an element of a semiconductor device and measuring the life time of said semiconductor device under each constant first electric stress and a time-sequence change in the value of said second electric stress;

a second step of calculating a relationship between said constant first electric stress which is implanted into the element of said semiconductor device and the life time of said semiconductor device under said constant first electric stress, based on a result of measurement of the life time which is measured at said first step under said constant first electric stress of each constant value;

a third step of calculating a characteristic of a time-sequence change in said first electric stress during application of said second electric stress having a predetermined value onto the element of said semiconductor device, based on the time-sequence change in said second electric stress which is measured at said first step;

a fourth step of dividing the time-sequence change in said first electric stress which is obtained at said third step under said second electric stress having the predetermined value into a plurality of minute periods, approximating the value of said first electric stress for each minute period and calculating a ratio at which the life time under said constant first electric stress which is calculated at said second step is consumed during each minute period; and a fifth step of determining the life time of the semiconductor device as the sum of the minute periods which is obtained when the accumulation value of life consumption ratios each during each minute period calculated at said fourth step reaches a predetermined value.

2. The method of presuming the life time of a semiconductor device of claim 1, wherein said life time is defined as a time until breakdown of for an element of the semiconductor device occurs, and each life consumption ratio during each minute period is calculated by dividing each minute period by a breakdown time under said constant first electric stress at said fourth step.

3. The method of presuming the life time of a semiconductor device of claim 1, wherein said life time is changed into a breakdown charge quantity of charges implanted until breakdown of the element of the semiconductor device occurs, a relationship between the value of said constant first electric stress and the quantity of charges which are implanted until breakdown of the element of the semiconductor device occurs is calculated at said second step, and each life consumption ratio is calculated by dividing the product of said first electric stress for each minute period and each minute period by said breakdown quantity under said constant first electric stress at said fourth step.

4. The method of presuming the life time of a semiconductor device of claim 1, wherein said second electric stress having the predetermined value is a constant value at said fourth step.

5. The method of presuming the life time of a semiconductor device of claim 1, wherein the life time of the semiconductor device includes an acceleration coefficient at said first and said third steps.

6. The method of presuming the life time of a semiconductor device of claim 1, wherein the life time of the semiconductor device is defined as the sum of the minute periods which is obtained when the accumulated value of life consumption ratios during the minute periods reaches an inverse number of a safety coefficient at said fifth step.

7. The method of presuming the life time of a semiconductor device of claim 1, wherein said first electric stress is a current and said second electric stress is a voltage.

8. The method of presuming the life time of a semiconductor device of claim 7, wherein the element of said semiconductor device is a gate oxide film.

9. The method of presuming the life time of a semiconductor device of claim 7, wherein the element of said semiconductor device is a ferro electric film of a memory.

10. The method of presuming the life time of a semiconductor device of claim 7, wherein a characteristic of the time-sequence change in the current is calculated at said second step by approximating that a current which flows in the element of said semiconductor device under a predetermined applied constant voltage remains constant until a predetermined time and then changes in proportion to a time to −0.4th power.

11. The method of presuming the life time of a semiconductor device of claim 10, wherein said element whose life time is presumed is a gate oxide film.

12. The method of presuming the life time of a semiconductor device of claim 11, wherein said gate oxide film has a thickness of 6 nm or larger.

13. A method of presuming a life time which is defined as a time from application of a predetermine constant voltage onto a metal wire of a semiconductor device until the metal wire becomes unusable, comprising:

a first step of implanting a constant current into the metal wire of the semiconductor device and measuring the life time of the metal wire and a time-sequence change in the voltage;

a second step of calculating a relationship between the value of the constant current implanted into the metal wire and the life time of the metal wire based on the life time of the metal wire which is measured at said first step;

a third step of calculating a time-sequence change in the current during application of the constant voltage onto the metal wire, based on the time-sequence change in the voltage which is measured at said first step;

a fourth step of dividing the time-sequence change in the current during application of the constant voltage which is obtained at said third step into a plurality of minute periods, approximating current values during the minute periods to a constant value and calculating a rate at which the life time during application of the constant current calculated at said second step is consumed during each minute period; and a fifth step of accumulating the life consumption ratios during the minute periods which are calculated at said fourth step in an order of time to yield an accumulation value and determining the sum of the minute periods which is obtained when the accumulation value reaches a predetermined value as the life time of the semiconductor device.

14. The method of presuming the life time of a semiconductor device of claim 13, wherein the life time of the metal wire is defined as a time required until breakdown of the metal wire, and a plurality of values of a constant current are implanted to electrically destroy the metal wire and the time required until breakdown of the metal wire is measured with each current value at said first step.

15. The method of presuming the life time of a semiconductor device of claim 14, wherein the life time is defined as the sum of the minute periods which is obtained when the accumulation value of the life consumption ratios during the minute periods reaches an inverse number of a safety coefficient at said fifth step.

* * * * *